(12) United States Patent
Oikawa

(10) Patent No.: US 11,662,640 B2
(45) Date of Patent: May 30, 2023

(54) ELECTRO-OPTICAL DEVICE WITH INTERLAYER INSULATING LAYERS AND CONTACT HOLES, AND ELECTRONIC APPARATUS

(71) Applicant: SEIKO EPSON CORPORATION, Tokyo (JP)

(72) Inventor: Hiroyuki Oikawa, Chitose (JP)

(73) Assignee: SEIKO EPSON CORPORATION, Tokyo (JP)

( * ) Notice: Subject to any disclaimer, the term of this patent is extended or adjusted under 35 U.S.C. 154(b) by 33 days.

(21) Appl. No.: 17/162,428

(22) Filed: Jan. 29, 2021

(65) Prior Publication Data
US 2021/0240024 A1   Aug. 5, 2021

(30) Foreign Application Priority Data
Jan. 30, 2020  (JP) .............. JP2020-013342

(51) Int. Cl.
| | | |
|---|---|---|
| *G02F 1/1368* | (2006.01) | |
| *G02F 1/1362* | (2006.01) | |
| *H01L 29/49* | (2006.01) | |
| *G03B 21/00* | (2006.01) | |
| *H01L 27/12* | (2006.01) | |

(52) U.S. Cl.
CPC ...... *G02F 1/1368* (2013.01); *G02F 1/136209* (2013.01); *G02F 1/136213* (2013.01); *G02F 1/136286* (2013.01); *G03B 21/006* (2013.01); *H01L 27/124* (2013.01); *H01L 29/4925* (2013.01)

(58) Field of Classification Search
CPC combination set(s) only.
See application file for complete search history.

(56) References Cited

U.S. PATENT DOCUMENTS

| | | | | |
|---|---|---|---|---|
| 2001/0052950 A1* | 12/2001 | Yamazaki | ............. | G02F 1/1368 349/43 |
| 2008/0143664 A1* | 6/2008 | Nakagawa | ............. | G02F 1/1368 345/92 |
| 2018/0173064 A1* | 6/2018 | Ohori | ............. | G02F 1/1368 |

FOREIGN PATENT DOCUMENTS

| | | |
|---|---|---|
| JP | 2008-151900 A | 7/2008 |
| JP | 2008-216621 A | 9/2008 |
| JP | 2009-047967 A | 3/2009 |
| JP | 2009-069246 A | 4/2009 |
| JP | 2009-139417 A | 6/2009 |
| JP | 2010-096966 A | 4/2010 |
| JP | 2012-103385 A | 5/2012 |
| JP | 2013-182144 A | 9/2013 |
| JP | 2013-183051 A | 9/2013 |
| JP | 2018-101067 A | 6/2018 |

(Continued)

*Primary Examiner* — Lauren Nguyen
(74) *Attorney, Agent, or Firm* — Oliff PLC

(57) ABSTRACT

In an electro-optical device, a transistor includes a semiconductor layer extending in a second direction so as to overlap with a scanning line in plan view. A second contact hole for electrically connecting the scanning line with a gate electrode of the transistor is provided in a second interlayer insulating layer provided in a layer between the scanning line and the transistor. The second contact hole includes a first hole portion extending along the second direction on both sides of the semiconductor layer in plan view, and a second hole portion protruding from the first hole portion toward the semiconductor layer and extending along a first direction.

9 Claims, 15 Drawing Sheets

(56) References Cited

FOREIGN PATENT DOCUMENTS

WO      2017/086116 A1    5/2017
WO      2018/074060 A1    4/2018

\* cited by examiner

ELECTRO-OPTICAL DEVICE WITH INTERLAYER INSULATING LAYERS AND CONTACT HOLES, AND ELECTRONIC APPARATUS

The present application is based on, and claims priority from JP Application Serial Number 2020-013342, filed Jan. 30, 2020, the disclosure of which is hereby incorporated by reference herein in its entirety.

BACKGROUND

1. Technical Field

The present disclosure relates to an electro-optical device in which a semiconductor layer of a transistor extends along a scanning line, and an electronic apparatus.

2. Related Art

An electro-optical device (a liquid crystal device) used as a light valve or the like of a projection-type display apparatus is provided with a semiconductor layer between a substrate main body and a pixel electrode, and a transistor is configured using the semiconductor layer. In such an electro-optical device, when light from a light source is incident on an LDD region, which is interposed between a pixel electrode-side source drain region electrically coupled to a pixel electrode side of the semiconductor layer, and a channel region, this causes an optical leakage current to be generated in the transistor. Thus, a structure is conceivable in which a semiconductor layer extending along a scanning line is provided so as to overlap with the scanning line, a gate electrode is provided on the opposite side from the scanning line with respect to the semiconductor layer, and the gate electrode and the scanning line are electrically coupled via an opening provided in both sides of the semiconductor layer (see FIG. 2B and the like of WO 2017/086116). According to such a structure, incidence of light on the LDD region can be suppressed by the gate electrode provided inside the opening.

However, in the case of a structure in which the semiconductor layer extends along the scanning line, on a side of a data line-side source drain region, which is electrically coupled to a data line in the semiconductor layer, a contact hole that electrically couples the data line and the source drain region needs to be provided, and a capacitance element and the like cannot be provided in the vicinity of the contact hole. Thus, in the case of the structure in which the semiconductor layer extends along the scanning line, the capacitance element, and the gate electrode provided in the opening cannot block light incident from the side of the data line-side source drain region. Therefore, in the case of the structure in which the semiconductor layer extends along the scanning line, there is a problem in that light incident from the side of the data line-side source drain region cannot be prevented from entering a side of the pixel electrode-side source drain region.

SUMMARY

In order to solve the problem described above, an electro-optical device according to an aspect of the present disclosure includes a data line extending along a first direction, a scanning line extending along a second direction intersecting the first direction, a transistor including a semiconductor layer extending, in the second direction, in an overlapping manner with the scanning line in plan view, a first interlayer insulating layer provided in a layer between the data line and the transistor, and including a first contact hole that electrically connects the data line with the semiconductor layer of the transistor, and a second interlayer insulating layer provided in a layer between the scanning line and the transistor, and including a second contact hole that electrically connects the scanning line with a gate electrode of the transistor. The second contact hole includes a first hole portion extending along the second direction on both sides of the semiconductor layer in plan view and a second hole portion extending along the first direction.

The electro-optical device according to the present disclosure is used for various electronic apparatuses. According to an aspect of the present disclosure, when the electronic apparatus is a projection-type display apparatus, the projection-type display apparatus is provided with a light source unit that emits a light to be supplied to the electro-optical device, and a projection optical system that projects the light modulated by the electro-optical device.

DESCRIPTION OF EXEMPLARY EMBODIMENTS

Figure 1:
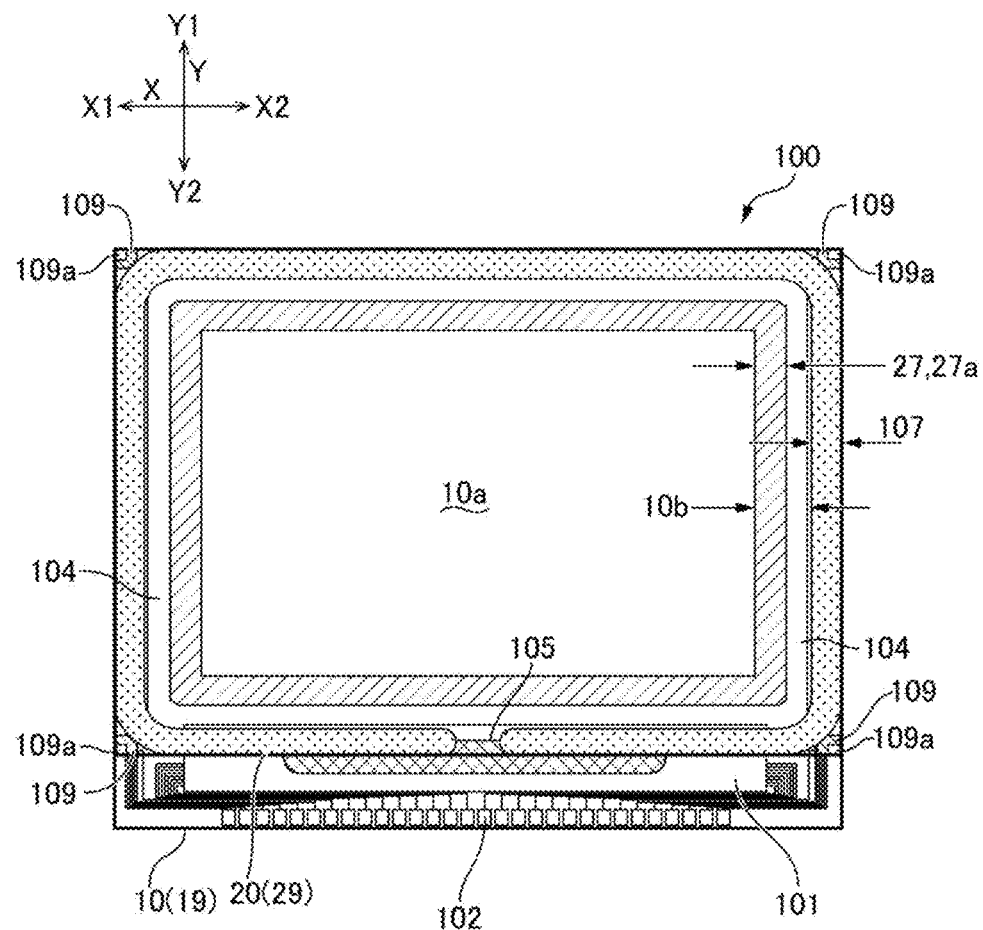
FIG. 1 is a plan view of an electro-optical device according to a first exemplary embodiment of the present disclosure.

Exemplary embodiments of the disclosure will be described below with reference to the drawings. Note that, in each of the figures to be referred to in the following description, to illustrate each layer, each member, and the like in a recognizable size in the drawings, each layer, each member, and the like are illustrated at a different scale. Further, in the following description, when each of layers formed in a first substrate 10 is described, an upper layer side or a front surface side means an opposite side (a side on which a second substrate 20 is located) to a side on which a substrate main body 19 is located, and a bottom layer side means the side on which the substrate main body 19 is located. Further, of two directions intersecting each other in an in-plane direction of the first substrate 10, a direction in which a data line 6a extends is referred to as a first direction Y, and a direction in which a scanning line 3a extends is referred to as a second direction X. Further, one side in the direction along the first direction Y is a first side Y1 in the first direction Y, the other side in the direction along the first direction Y is a second side Y2 in the first direction Y, one side in the direction along the second direction X is a first side X1 in the second direction X, and the other side in the direction along the second direction X is a second side X2 in the second direction X.

First Exemplary Embodiment

1. Configuration of Electro-Optical Device 100

Figure 2:
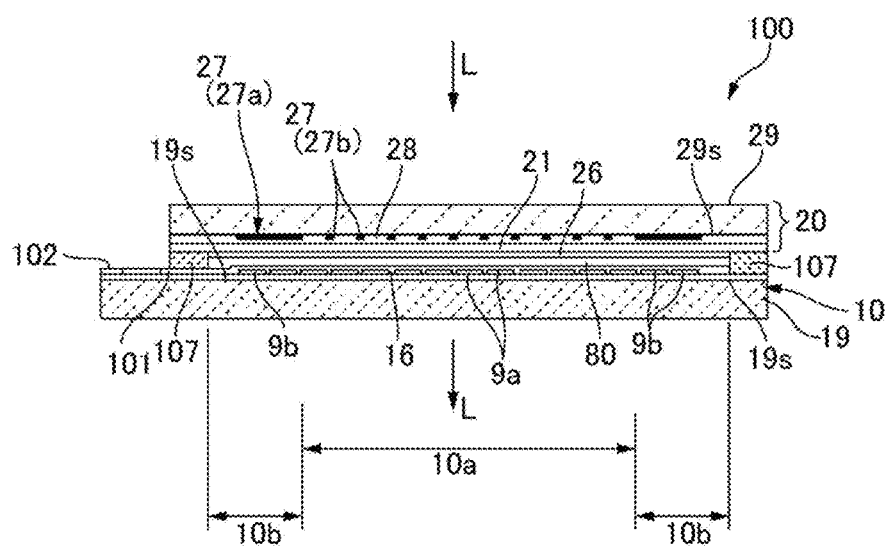
FIG. 2 is a cross-sectional view of the electro-optical device illustrated in FIG. 1.

FIG. 1 is a plan view of an electro-optical device 100 according to a first exemplary embodiment of the present disclosure. FIG. 2 is a cross-sectional view illustrating the electro-optical device 100 illustrated in FIG. 1. As illustrated in FIG. 1 and FIG. 2, in the electro-optical device 100, a first substrate 10 and a second substrate 20 are bonded together by a seal material 107 with a predetermined gap therebetween, and the first substrate 10 and the second substrate 20 face each other. The seal material 107 is provided in a frame shape so as to follow an outer edge of the second substrate 20, and an electro-optical layer 80 such as a liquid crystal layer is provided in a region surrounded by the seal material 107, between the first substrate 10 and the second substrate 20. The seal material 107 is a photocurable adhesive, or a photocurable and thermosetting adhesive, and a gap material, such as glass fiber or glass beads, for setting a distance between the substrates to a predetermined value, is mixed in the seal material 107. In the present exemplary embodiment, both the first substrate 10 and the second substrate 20 have a quadrangular shape, and in a substantially central portion of the electro-optical panel 100, a display region 10a is provided as a quadrangular region. In accordance with such a shape, the seal material 107 is also provided in a substantially quadrangular shape, and a peripheral region 10b having a rectangular frame shape is provided between an inner peripheral edge of the seal material 107 and an outer peripheral edge of the display region 10a.

The first substrate 10 includes a substrate main body 19 formed by a light-transmitting substrate, such as a quartz substrate, a glass substrate, or the like. On a first surface 19s side, which is the second substrate 20 side of the substrate main body 19, outside the display region 10a, a data line driving circuit 101 and a plurality of terminals 102 are formed along one side of the first substrate 10, and scanning line driving circuits 104 are formed along other sides adjacent to the one side. Although not illustrated, a flexible wiring substrate is coupled to the terminals 102, and various potentials and various signals are input to the first substrate 10 via the flexible wiring substrate.

On the first surface 19s side of the substrate main body 19, in the display region 10a, a plurality of pixel electrodes 9a, which are transmissive and formed of an indium tin oxide (ITO) film and the like, are formed in a matrix pattern. A first oriented film 16 is formed on the second substrate 20 side with respect to the pixel electrodes 9a, and the pixel electrodes 9a are covered with the first oriented film 16.

The second substrate 20 includes a substrate main body 29 formed by a transmissive substrate, such as a quartz substrate, a glass substrate, or the like. On the substrate main body 29, a transmissive common electrode 21, which is formed of the ITO film and the like, is formed on the side of a first surface 29s that faces the first substrate 10, and a second oriented film 26 is formed on the first substrate 10 side with respect to the common electrode 21. The common electrode 21 is formed over substantially the entire surface of the second substrate 20, and is covered with the second oriented film 26. On the second substrate 20, a light shielding layer 27, which has light shielding properties and is formed by a resin, a metal, or a metal compound, is formed between the substrate main body 29 and the common electrode 21, and a transmissive protective layer 28 is formed between the light shielding layer 27 and the common electrode 21. The light shielding layer 27 is formed, for example, as a partition 27a having a frame-like shape extending along the outer peripheral edge of the display region 10a. The light shielding layer 27 is also formed as a light shielding layer 27b that configures a black matrix in regions overlapping in plan view with regions respectively interposed between the pixel electrodes 9a adjacent to each other. Dummy pixel electrodes 9b, which are formed simultaneously with the pixel electrodes 9a, are formed in regions of the peripheral region 10b of the first substrate 10 that overlap with the partition 27a in plan view. Note that a lens may be provided on the second substrate 20 at a position facing the pixel electrodes 9a, and in this case, the light shielding layer 27b is not often formed.

The first oriented film 16 and the second oriented film 26 are each, for example, an inorganic oriented film formed by a diagonally vapor-deposited film of $SiO_x$ (x<2), $SiO_2$, $TiO_2$, MgO, $Al_2O_3$, or the like, and liquid crystal molecules having negative dielectric anisotropy used for the electro-optical layer 80 are diagonally oriented. Therefore, the liquid crystal molecules form a predetermined angle with respect to the first substrate 10 and the second substrate 20. In this way, the electro-optical device 100 is configured as a vertical alignment (VA) mode liquid crystal device.

On the first substrate 10, inter-substrate conduction electrodes 109 for establishing electrical conduction between the first substrate 10 and the second substrate 20 are formed in regions located outside the seal material 107 and overlapping with corner portions of the second substrate 20. An inter-substrate conduction material 109a including conductive particles is disposed in the inter-substrate conduction electrode 109, and the common electrode 21 of the second substrate 20 is electrically coupled to the first substrate 10 side via the inter-substrate conduction material 109a and the inter-substrate conduction electrode 109. Thus, a common potential is applied to the common electrode 21 from the first substrate 10 side.

In the electro-optical device 100, the pixel electrodes 9a and the common electrode 21 are formed of a transmissive conductive film such as the ITO film, and the electro-optical device 100 is configured as a transmissive liquid crystal device. In the electro-optical device 100, light that is incident on the electro-optical layer 80 from one of the first substrate 10 and the second substrate 20 is modulated while passing through the other substrate and being emitted, and displays an image. In the present exemplary embodiment, as indicated by an arrow L, light incident from the second substrate 20 is modulated by the electro-optical layer 80 for each pixel while passing through the first substrate 10 and being emitted, and displays an image.

2. Schematic Configuration of Pixels

Figure 3:
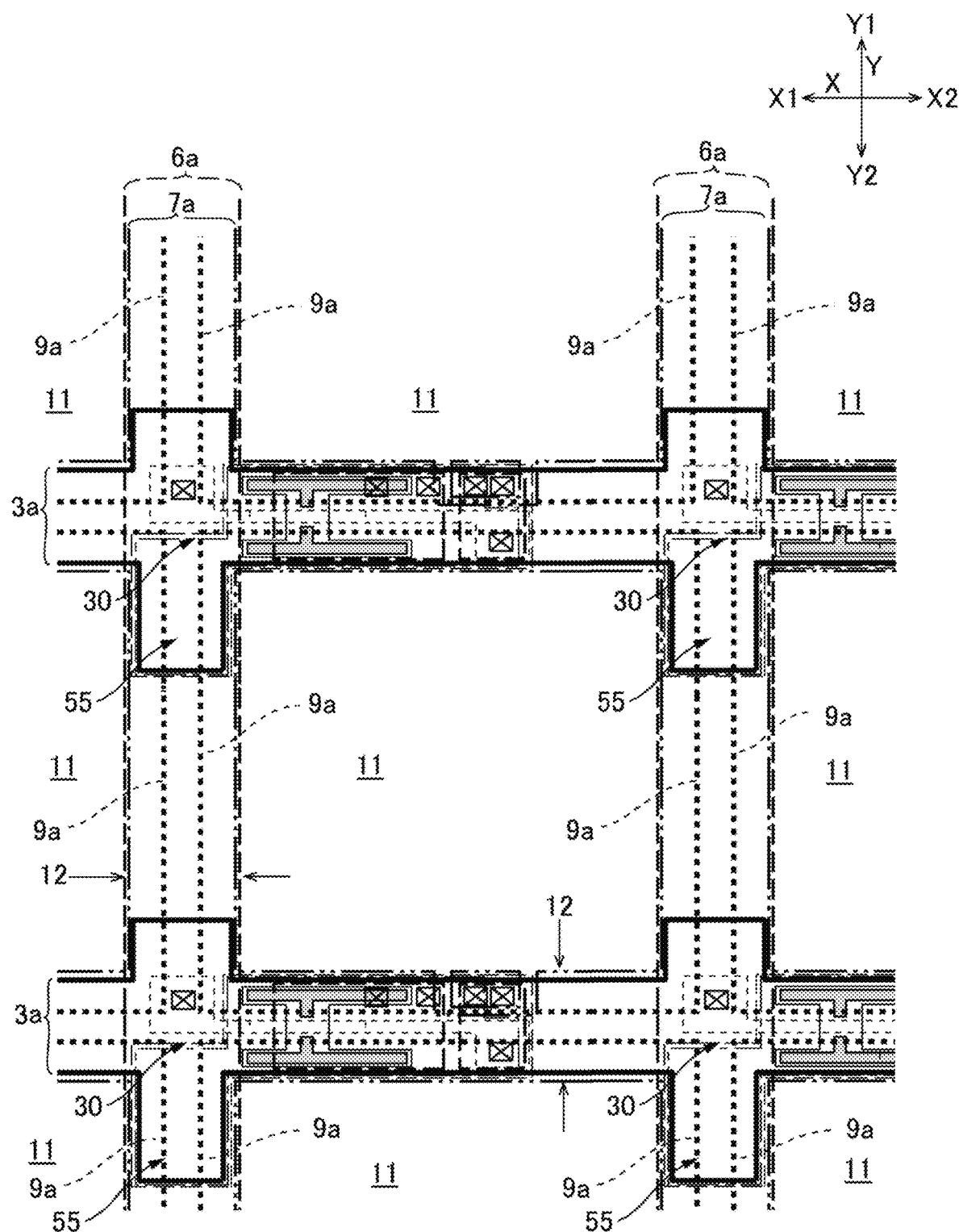
FIG. 3 is a plan view of a plurality of pixels adjacent to each other in the electro-optical device illustrated in FIG. 1.
Figure 4:
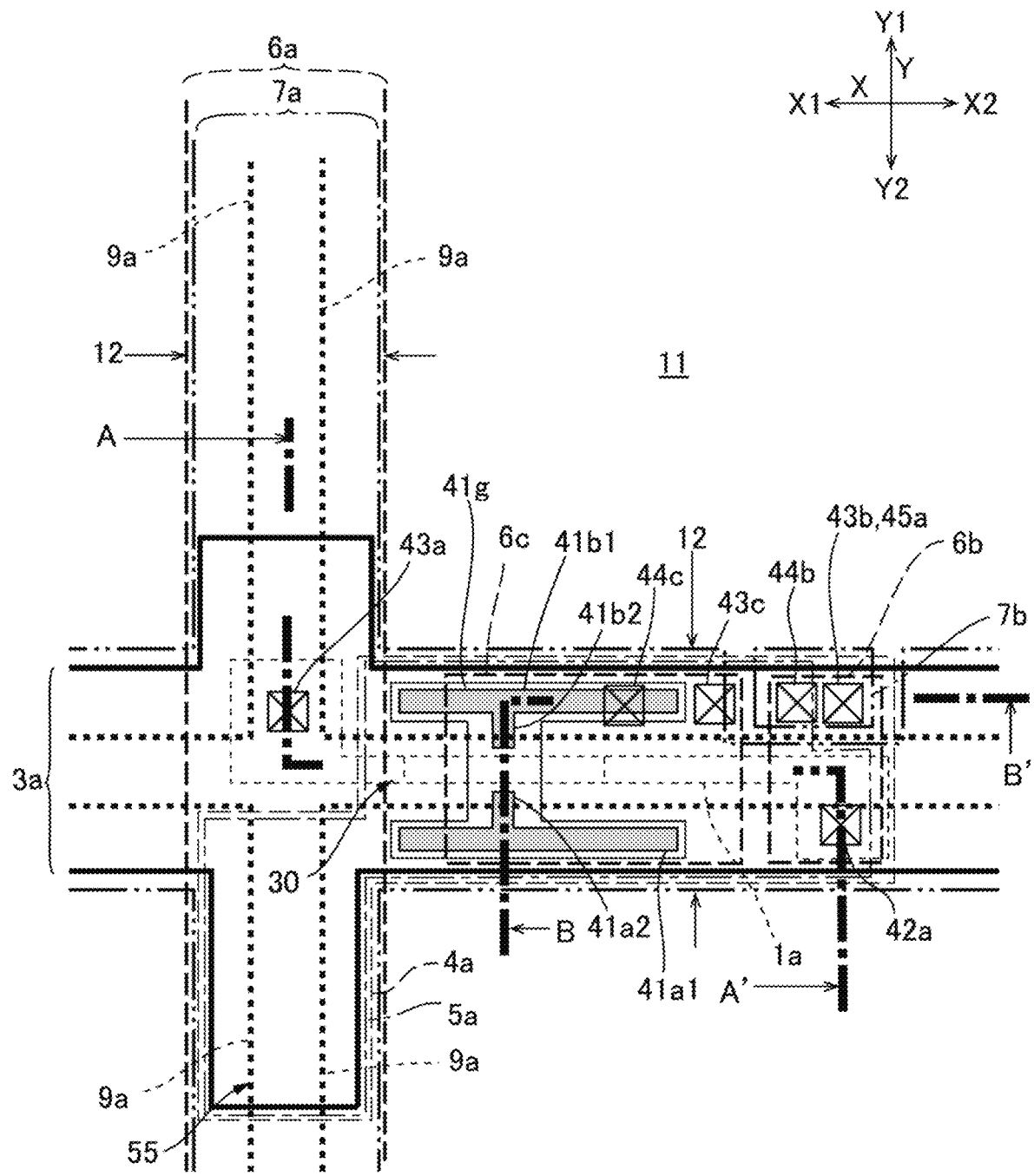
FIG. 4 is an enlarged plan view illustrating one of the pixels illustrated in FIG. 3.
Figure 5:
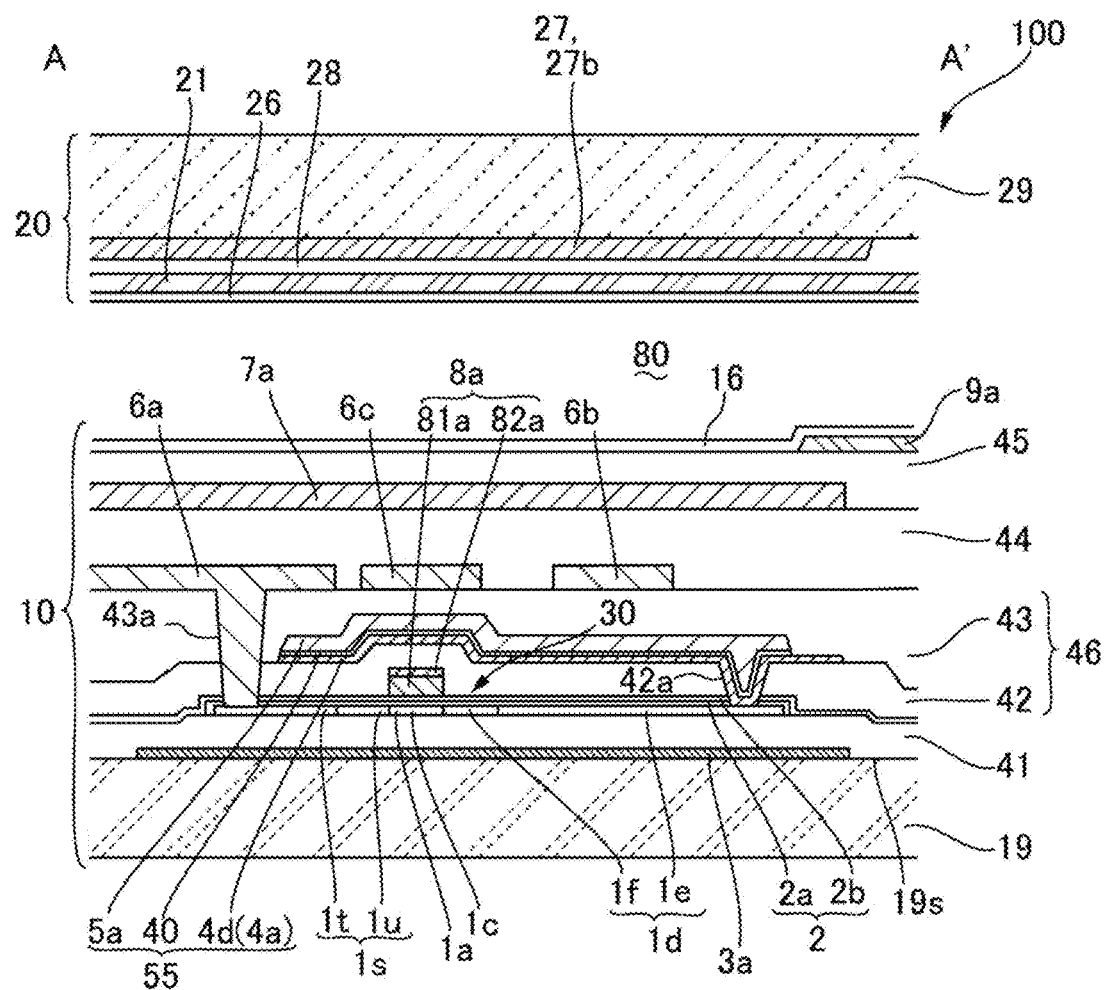
FIG. 5 is a cross-sectional view taken along a line A-A' illustrated in FIG. 4.
Figure 6:
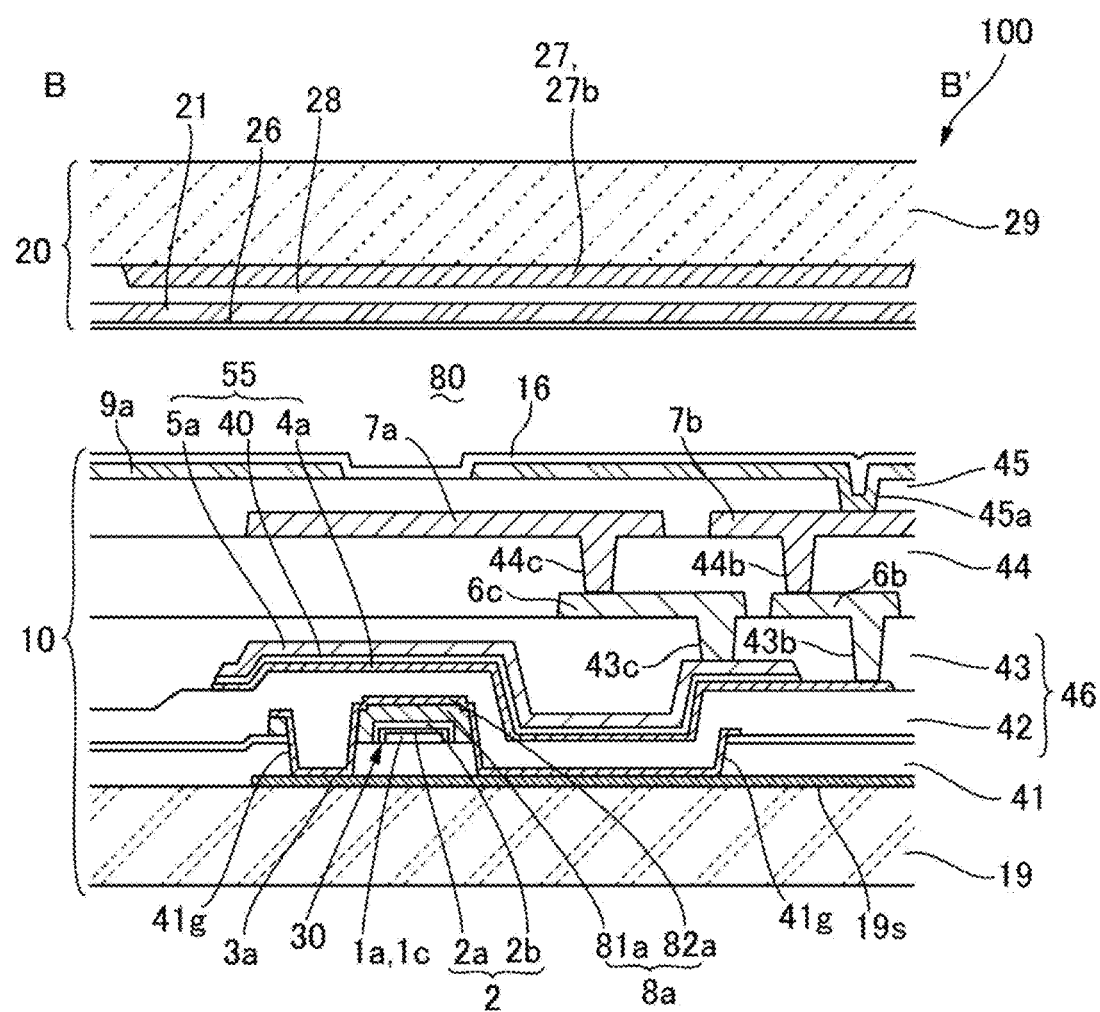
FIG. 6 is a cross-sectional view taken along a line B-B' illustrated in FIG. 4.

FIG. 3 is a plan view of a plurality of pixels adjacent to each other in the electro-optical device 100 illustrated in FIG. 1. FIG. 4 is an enlarged plan view illustrating one of the pixels illustrated in FIG. 3, and an enlarged view around the transistor 30 is illustrated in FIG. 4. FIG. 5 is a cross-sectional view taken along a line A-A' illustrated in FIG. 4. FIG. 6 is a cross-sectional view taken along a line B-B' illustrated in FIG. 4. Note that, in FIG. 3 and FIG. 4, and FIG. 7 to FIG. 9 to be described later, each of the layers are respectively indicated by lines described below. Further, in FIG. 3 and FIG. 4, and FIG. 7 to FIG. 9 to be described later, for the layers whose end portions overlap with each other in plan view, positions of the end portions are shifted to make the shape and the like of the layers easily recognizable. Further, a second contact hole 41g is indicated by gray regions.

The scanning line 3a is indicated by a thick solid line

A semiconductor layer 1a is indicated by a thin broken line of short dashes.

A gate electrode 8a is indicated by a thin solid line.

A first capacitance electrode 4a is indicated by a thin broken line of long dashes.

A second capacitance electrode 5a is indicated by a thin one-dot chain line.

The data line 6a and relay electrodes 6b and 6c are indicated by thick broken lines of long dashes.

A capacitance line 7a and a relay electrode 7b are indicated by thick two-dot chain lines.

The pixel electrodes 9a are indicated by thick broken lines of short dashes.

As illustrated in FIG. 3 and FIG. 4, the pixel electrode 9a is formed in each of the plurality of pixels on a surface of the first substrate 10 facing the second substrate 20, and the scanning line 3a, the data line 6a, and the capacitance line 7a extend along an inter-pixel region interposed between the pixel electrodes 9a adjacent to each other. The data line 6a extends in the first direction Y in the inter-pixel region, and the scanning line 3a extends in the second direction X in the inter-pixel region. The capacitance line 7a extends in the first direction Y and the second direction X in the inter-pixel region. Further, the transistor 30 is formed corresponding to an intersection between the data line 6a and the scanning line 3a. Here, the scanning line 3a, the data line 6a, and the capacitance line 7a have light shielding properties. Therefore, a region in which the scanning lines 3a, the data lines 6a, the capacitance lines 7a, and electrodes provided in the same layer as those wiring lines are formed is a light shielding region 12 through which light is not transmitted, and regions surrounded by the light shielding region 12 are aperture regions 11 through which light is transmitted.

As illustrated in FIG. 5 and FIG. 6, in the first substrate 10, a second interlayer insulating layer 41, a first interlayer insulating layer 46, and interlayer insulating layers 44 and 45 are sequentially layered in this order from the substrate main body 19 side, between the substrate main body 19 and the pixel electrodes 9a. Each of the second interlayer insulating layer 41, the first interlayer insulating layer 46, and the interlayer insulating layers 44 and 45 is formed of a transmissive insulating film such as silicon oxide. The first interlayer insulating layer 46 is formed by an interlayer insulating layer 42, and an interlayer insulating layer 43 layered on the interlayer insulating layer 42 on the pixel electrode 9a side. In the present exemplary embodiment, surfaces, on the pixel electrode 9a side, of the first interlayer insulating layer 46 and the interlayer insulating layer 45 are each formed as a continuous flat surface by chemical machine polishing or the like. In the present exemplary embodiment, various wiring lines and the transistors 30 are provided using a space between the interlayer insulating layer and the substrate main body 19, and spaces between the interlayer insulating layers.

3. Detailed Description of Each Layer

Figure 7:
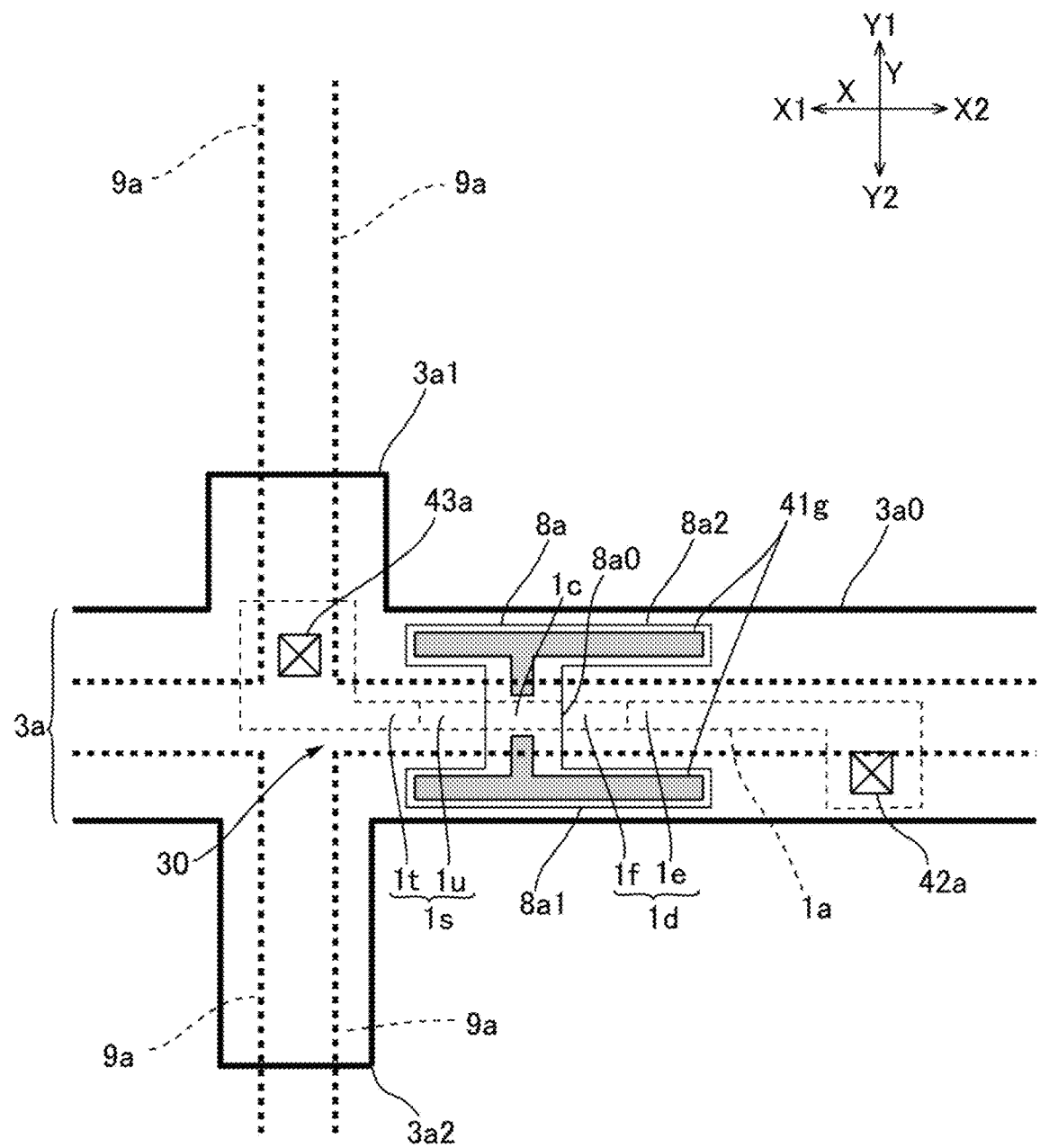
FIG. 7 is a plan view of a scanning line, a semiconductor layer, a gate electrode, and the like illustrated in FIG. 5 and FIG. 6.
Figure 8:
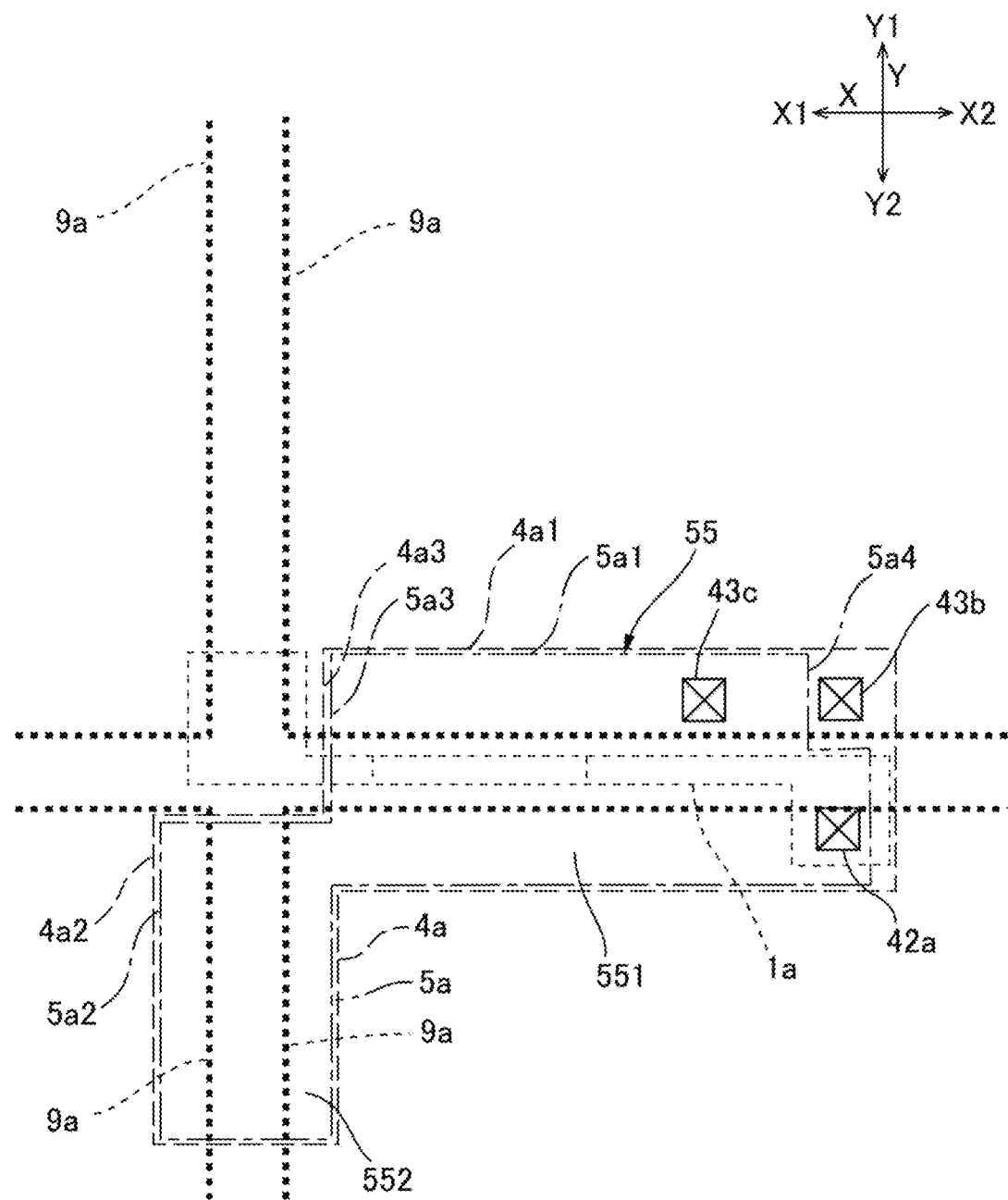
FIG. 8 is a plan view of a first capacitance electrode, a second capacitance electrode, and the like illustrated in FIG. 5 and FIG. 6.
Figure 9:
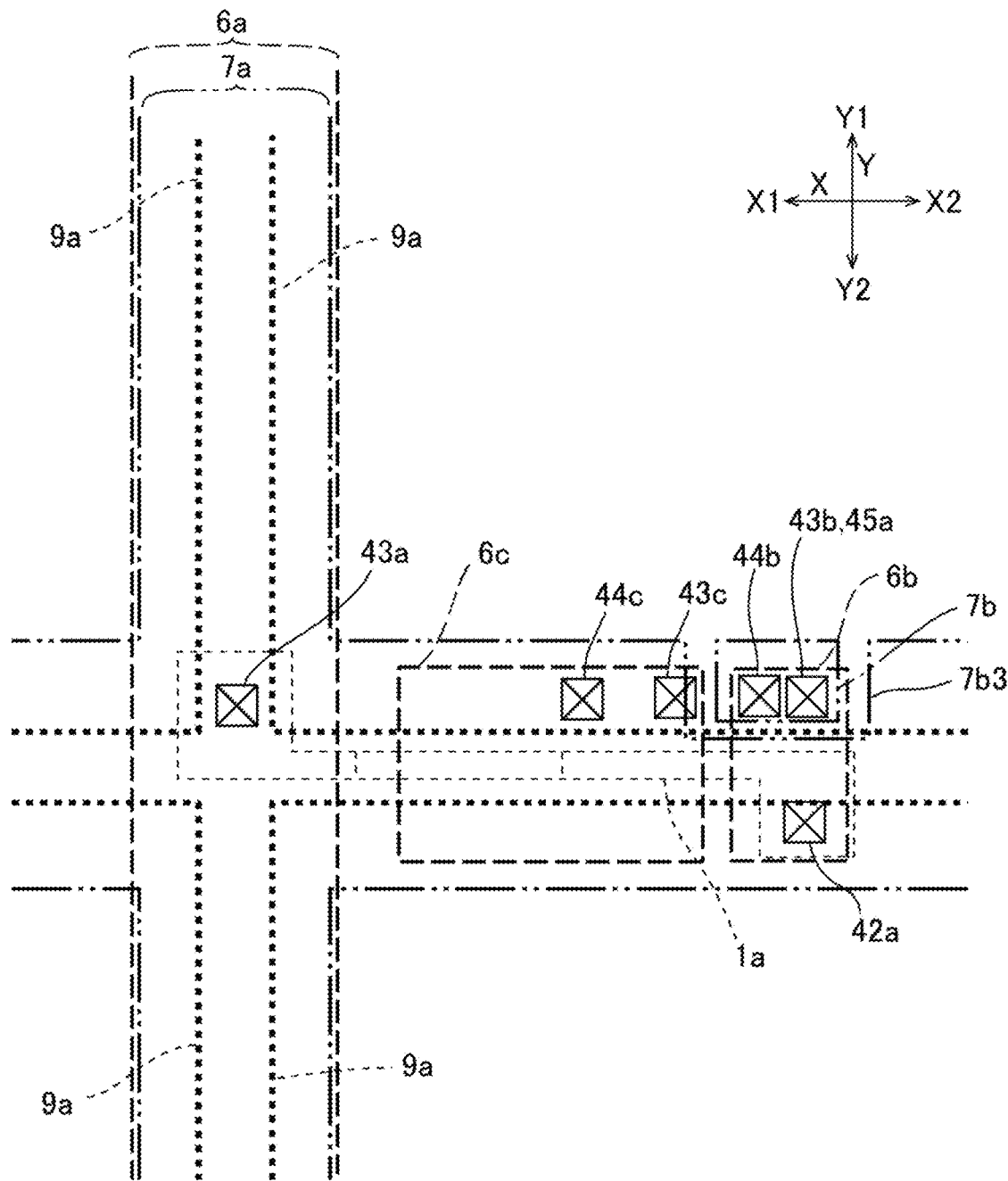
FIG. 9 is a plan view of a data line, a capacitance line, and the like illustrated in FIG. 5 and FIG. 6.

A detailed configuration of the first substrate 10 will be described with reference to FIG. 5 and FIG. 6, while referring as necessary to FIG. 7 to FIG. 9 to be described below. FIG. 7 is a plan view of the scanning line 3a, the semiconductor layer 1a, the gate electrode 8a, and the like illustrated in FIG. 5 and FIG. 6. FIG. 8 is a plan view of the first capacitance electrode 4a, the second capacitance electrode 5a, and the like illustrated in FIG. 5 and FIG. 6. FIG. 9 is a plan view of the data line 6a, the capacitance line 7a, and the like illustrated in FIG. 5 and FIG. 6. Note that, in FIG. 7 to FIG. 9, contact holes relating to electrical coupling of electrodes and the like illustrated in those figures are illustrated, and at the same time, the semiconductor layer 1a and the pixel electrodes 9a are illustrated for the purpose of indicating reference positions.

First, as illustrated in FIG. 5 and FIG. 6, in the first substrate 10, the scanning line 3a extending along the second direction X is formed between the substrate main body 19 and the second interlayer insulating layer 41. The scanning line 3a is formed of a conductive film having light shielding properties such as a metal silicide film, a metal film, a metal compound film, or the like. In the present exemplary embodiment, the scanning line 3a is formed from tungsten silicide (WSi), tungsten, titanium nitride, or the like. The transistor 30 for pixel switching is configured between the second interlayer insulating layer 41, and the interlayer insulating layer 42 of the first interlayer insulating layer 46. The transistor 30 includes the semiconductor layer 1a formed on the surface of the interlayer insulating layer 42 on the opposite side from the substrate main body 19, a gate insulating layer 2 layered on the pixel electrode 9a side of the semiconductor layer 1a, and the gate electrode 8a overlapping with the semiconductor layer 1a on the pixel electrode 9a side of the gate insulating layer 2 in plan view. The semiconductor layer 1a is configured by a polysilicon film and the like. The gate insulating layer 2 has a two-layer structure configured by a first gate insulating layer 2a that is formed of a silicon oxide film obtained by thermally oxidizing the semiconductor layer 1a, and a second gate insulating layer 2b that is formed of a silicon oxide film formed, for example, by a low pressure CVD method. The gate electrode 8a is formed of a conductive film such as a conductive polysilicon film, a metal silicide film, a metal film, or a metal compound film.

The second contact hole 41g for electrically coupling the scanning line 3a with the gate electrode 8a of the transistor 30 is provided in the second interlayer insulating layer 41. A detailed configuration of the second contact hole 41g will be described below with reference to FIG. 10 to FIG. 12.

As illustrated in FIG. 7, the scanning line 3a includes a wiring portion 3a0 extending linearly along the second direction X, and protruding portions 3a1 and 3a2 protruding from the wiring portion 3a0 so as to overlap with the data line 6a on both sides in the first direction Y.

The semiconductor layer 1a extends from an intersecting section of the scanning line 3a and the data line 6a to the second side X2 in the second direction X, and a portion thereof overlapping with the gate electrode 8a in plan view is a channel region 1c. In the present exemplary embodiment, the transistor 30 has a lightly doped drain (LDD) structure. Therefore, on the semiconductor layer 1a, a first region 1s provided on the first side X1 in the second direction X with respect to the channel region 1c, on which the data line 6a is located, includes a data line-side source drain region 1t separated from the channel region 1c, and a data line-side LDD region 1u interposed between the data line-side source drain region 1t and the channel region 1c. The data line-side LDD region 1u has a lower impurity concentration than the data line-side source drain region 1t. Further, on the semiconductor layer 1a, a second region 1d provided on the second side X2 in the second direction X with respect to the channel region 1c, which is the opposite side from the data line 6a, includes a pixel electrode-side source drain region 1e separated from the channel region 1c, and a pixel electrode-side LDD region 1f interposed between the pixel electrode-side source drain region 1e and the channel region 1c. The pixel electrode-side LDD region 1f has a lower impurity concentration than the pixel electrode-side source drain region 1e.

The gate electrode 8a includes a first electrode portion 8a0 extending in the first direction Y so as to overlap with the semiconductor layer 1a in plan view with the gate insulating layer 2 interposed therebetween, and second electrode portions 8a1 and 8a2 extending in the second direction X along the semiconductor layer 1a from both end portions, in the first direction Y, of the first electrode portion 8a0 on both sides of the semiconductor layer 1a in the first direction Y. The second electrode portions 8a1 and 8a2 do not overlap with the semiconductor layer 1a in plan view.

Returning to FIG. 5 and FIG. 6, the first interlayer insulating layer 46 formed by the interlayer insulating layers 42 and 43 is formed on the upper layer side of the transistor 30. Between the interlayer insulating layer 42 and the interlayer insulating layer 43, a capacitance element 55 is provided that includes the first capacitance electrode 4a, a dielectric layer 40, and the second capacitance electrode 5a. The capacitance element 55 is a retention capacitor that prevents fluctuations in image signals retained by a liquid crystal capacitor, which is configured between the pixel electrode 9a of the first substrate 10 and the common electrode 21 of the second substrate 20. The first capacitance electrode 4a and the second capacitance electrode 5a are each formed of a conductive film having light shielding properties such as a metal silicide film, a metal film, a metal compound film, or the like.

As illustrated in FIG. 8, the first capacitance electrode 4a includes a main body portion 4a1 extending in the second direction X so as to overlap with the scanning line 3a and the semiconductor layer 1a in plan view, and a protruding portion 4a2 protruding from the main body portion 4a1 so as to overlap with the data line 6a in plan view. An end portion of the main body portion 4a1 is electrically coupled to the pixel electrode-side source drain region 1e of the semiconductor layer 1a via a contact hole 42a formed in the interlayer insulating layer 42. The first capacitance electrode 4a is provided with a notch 4a3 so as not to overlap in plan view with an end portion, overlapping with the data line 6a, of the semiconductor layer 1a.

The second capacitance electrode 5a includes a main body portion 5a1 that overlaps with the main body portion 4a1 of the first capacitance electrode 4a in plan view, and a protruding portion 5a2 overlapping with the protruding portion 4a2 of the first capacitance electrode 4a in plan view. Therefore, the capacitance element 55 includes a first element portion 551 extending in the second direction X so as to overlap with the semiconductor layer 1a, and a second element portion 552 extending in the first direction Y so as to overlap with the data line 6a. Further, similarly to the first capacitance electrode 4a, the second capacitance electrode 5a is provided with a notch 5a3 so as not to overlap with the end portion, overlapping with the data line 6a, of the semiconductor layer 1a in plan view. Further, in an end portion, on the second side X2 in the second direction X, of the main body portion 5a1 of the second capacitance electrode 5a, a notch portion 5a4 is formed such that the second capacitance electrode 5a does not overlap with the end portion of the main body portion 4a1 of the first capacitance electrode 4a.

Returning to FIG. 5 and FIG. 6 again, the interlayer insulating layers 44 and 45 are formed on the upper layer side of the interlayer insulating layer 43. In the space between the interlayer insulating layer 43 and the interlayer insulating layer 44, the data line 6a and the relay electrodes 6b and 6c are provided. The data line 6a and the relay electrodes 6b and 6c are formed of the same conductive film. The data line 6a and the relay electrodes 6b and 6c are each formed of a conductive film having light shielding properties such as a metal silicide film, a metal film, a metal compound film, or the like. For example, the data line 6a and the relay electrodes 6b and 6c are formed by a multilayer structure of a titanium layer/a titanium nitride layer/an aluminum layer/a titanium nitride layer, or a multilayer structure of a titanium nitride layer/an aluminum layer/a titanium nitride layer.

A contact hole 43a is provided in the first interlayer insulating layer 46 that is formed by the interlayer insulating layers 42 and 43, and the contact hole 43a penetrates the first interlayer insulating layer 46 and the gate insulating layer 2. The data line 6a is electrically coupled to the data line-side source drain region 1t via the contact hole 43a. The contact hole 43a is formed in a section corresponding to the notch 4a3 of the first capacitance electrode 4a and the notch 5a3 of the second capacitance electrode 5a, which are described above with reference to FIG. 8. Therefore, the contact hole 43a and the capacitance element 55 can be separated from each other. A contact hole 43b is provided in the interlayer insulating layer 43, and the contact hole 43b penetrates the interlayer insulating layer 43. The relay electrode 6b is electrically coupled to the first capacitance electrode 4a via the contact hole 43b. The contact hole 43b is formed in a section corresponding to the notch 5a4 of the second capacitance electrode 5a, which is described above with reference to FIG. 8. A contact hole 43c is provided in the interlayer insulating layer 43, and the relay electrode 6c is electrically coupled to the second capacitance electrode 5a via the contact hole 43c.

In the space between the interlayer insulating layer 44 and the interlayer insulating layer 45, the capacitance line 7a and the relay electrode 7b are provided. The capacitance line 7a and the relay electrode 7b are formed of the same conductive film. The capacitance line 7a and the relay electrode 7b are each formed of a conductive film having light shielding properties such as a metal silicide film, a metal film, a metal compound film, or the like. For example, the capacitance line 7a and the relay electrode 7b are formed by the multilayer structure of a titanium layer/a titanium nitride layer/an aluminum layer/a titanium nitride layer, or the multilayer structure of a titanium nitride layer/an aluminum layer/a titanium nitride layer.

A contact hole 44c is provided in the interlayer insulating layer 44, and the capacitance line 7a is electrically coupled to the relay electrode 6c via the contact hole 44c. Therefore, the capacitance line 7a is electrically coupled to the second capacitance electrode 5a via the relay electrode 6c, and the common potential is applied to the second capacitance electrode 5a from the capacitance line 7a. A contact hole 44b is provided in the interlayer insulating layer 44, and the relay electrode 7b is electrically coupled to the relay electrode 6b via the contact hole 44b.

A contact hole 45a is provided in the interlayer insulating layer 45, and the pixel electrode 9a is electrically coupled to the relay electrode 7b via the contact hole 45a. Therefore, the pixel electrode 9a is electrically coupled to the first capacitance electrode 4a via the relay electrodes 7b and 6b. Here, since the first capacitance electrode 4a is electrically coupled to the pixel electrode-side source drain region 1e via the contact hole 42a, the pixel electrode 9a is electrically coupled to the pixel electrode-side source drain region 1e via the first capacitance electrode 4a.

4. Configuration of Periphery of Second Contact Hole 41g

Figure 10:
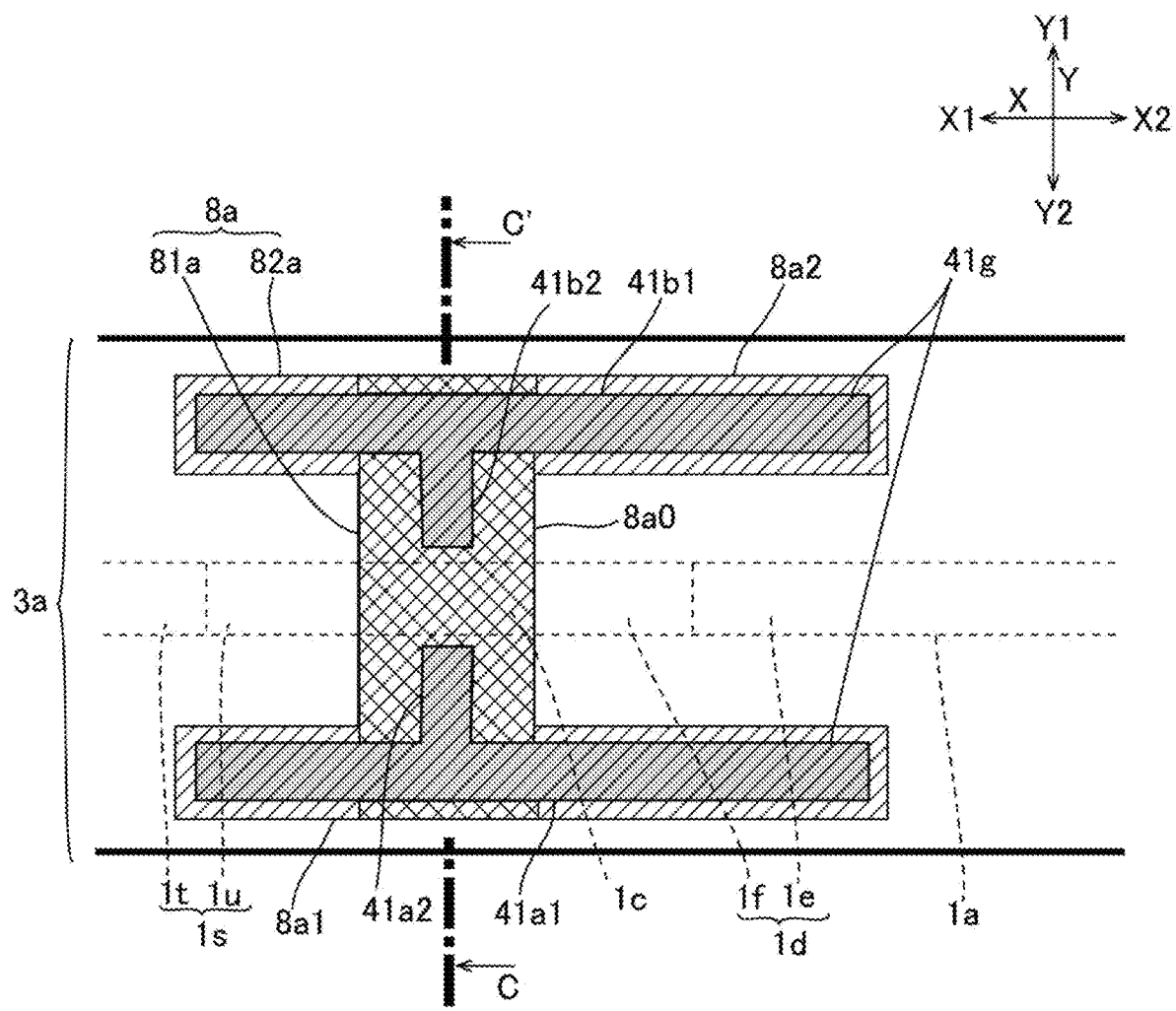
FIG. 10 is an enlarged plan view of the periphery of a second contact hole illustrated in FIG. 7.
Figure 11:
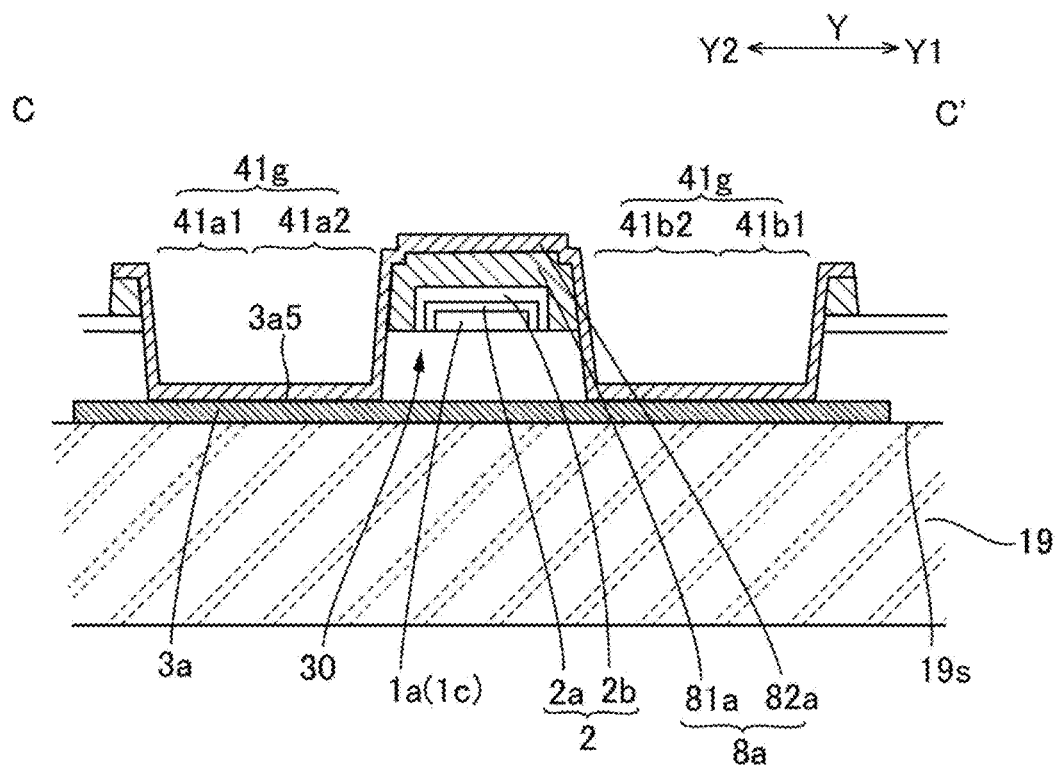
FIG. 11 is a cross-sectional view taken along a line C-C' illustrated in FIG. 10.

FIG. 10 is an enlarged plan view of the periphery of the second contact hole 41g illustrated in FIG. 7. FIG. 11 is a cross-sectional view taken along a line C-C' illustrated in FIG. 10. The gate electrode 8a is formed by layering a polysilicon layer 81a and a light shielding layer 82a. Note that in FIG. 10, the polysilicon layer 81a is hatched by diagonal lines sloping downward to the right, and the light shielding layer 82a is hatched by diagonal lines sloping upward to the right. Therefore, a region hatched by both the diagonal lines sloping downward to the right and the diagonal lines sloping upward to the right indicates that both the polysilicon layer 81a and the light shielding layer 82a are layered in the region.

As illustrated in FIG. 10 and FIG. 11, the second contact hole 41g includes first hole portions 41a1 and 41b1 extending along the second direction X on both sides of the semiconductor layer 1a, and second hole portions 41a2 and 41b2 extending along the first direction Y. The first hole portions 41a1 and 41b1 and the second hole portions 41a2 and 41b2 are all provided at positions overlapping with both the gate electrode 8a and the scanning line 3a in plan view. Therefore, portions of the gate electrode 8a are disposed inside the first hole portions 41a1 and 41b1 and the second hole portions 41a2 and 41b2, and are in contact with a surface 3a5 on the semiconductor layer 1a side of the scanning line 3a. Therefore, the gate electrode 8a is electrically coupled to the scanning line 3a, and thus, a scanning signal is applied to the gate electrode 8a from the scanning line 3a.

Here, the first hole portions 41a1 and 41b1 are provided at least along the pixel electrode-side LDD region 1f. In the present exemplary embodiment, the first hole portions 41a1 and 41b1 at least extend from both sides of the data line-side LDD region 1u to both sides of the pixel electrode-side LDD region 1f, via both sides of the channel region 1c.

The second hole portions 41a2 and 41b2 are portions respectively protruding from the first hole portions 41a1 and 41b1 up to the vicinity of the semiconductor layer 1a. The second hole portions 41a2 and 41b2 respectively protrude from the first hole portions 41a1 and 41b1 toward the channel region 1c of the semiconductor layer 1a.

In the present exemplary embodiment, the gate electrode 8a is configured by layering the conductive polysilicon layer 81a that extends in the first direction Y so as to intersect the semiconductor layer 1a, and the light shielding layer 82a covering the polysilicon layer 81a. The light shielding layer 82a is formed from a material having higher light shielding properties than the polysilicon layer 81a. For example, the light shielding layer 82a is formed of a light shielding film such as a tungsten silicide.

The light shielding layer 82a is formed over a wider area than the polysilicon layer 81a and covers the entire polysilicon layer 81a. Therefore, in a region of the gate electrode 8a in which the polysilicon layer 81a is formed, the polysilicon layer 81a and the light shielding layer 82a are provided forming a two-layer structure, and in a region of the gate electrode 8a in which the polysilicon layer 81a is not formed, only the light shielding layer 82a is provided forming a single-layer structure. For example, in the gate electrode 8a, the polysilicon layer 81a is not formed inside the second contact hole 41g, and the interior of the second contact hole 41g has the single-layer structure configured by the light shielding layer 82a. Therefore, the light shielding layer 82a is provided along the entire side surface of the second contact hole 41g. On the other hand, of the first electrode portion 8a0 extending in the first direction Y in the gate electrode 8a, a portion outside the second contact hole 41g has the two-layer structure configured by the polysilicon layer 81a and the light shielding layer 82a. Note that portions provided on both sides in the extending direction of the first hole portions 41a1 and 41b1 have the single-layer structure configured by the light shielding layer 82a.

5. Method for Manufacturing Electro-Optical Device 100

Figure 12:
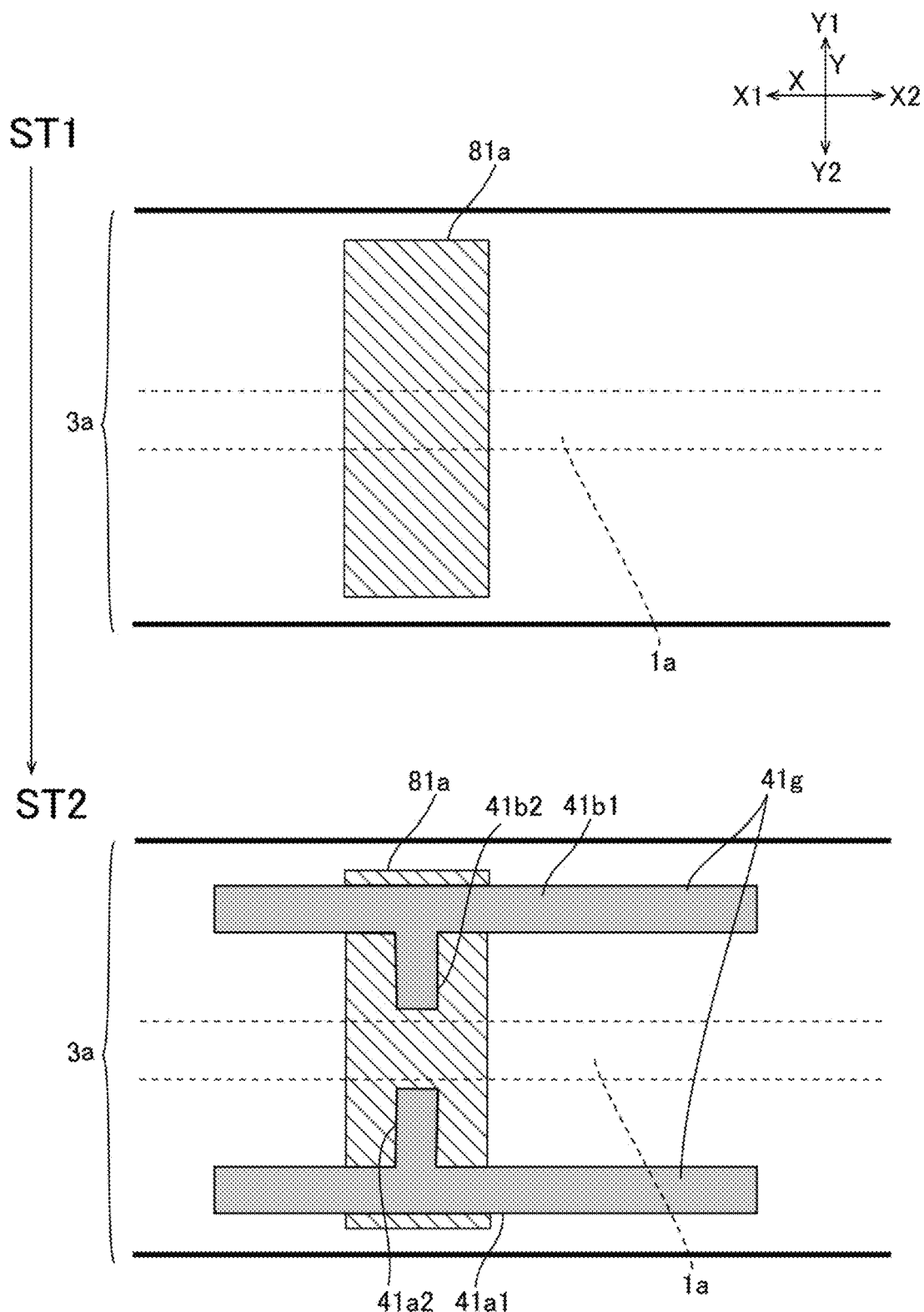
FIG. 12 is an explanatory diagram illustrating a method for manufacturing the electro-optical device illustrated in FIG. 1.

FIG. 12 is an explanatory diagram illustrating a method for manufacturing the electro-optical device 100 illustrated in FIG. 1, and is an explanatory diagram illustrating steps for forming the gate electrode 8a. When manufacturing the gate electrode 8a illustrated in FIG. 10 and FIG. 11, after forming the scanning line 3a, the second interlayer insulating layer 41, the semiconductor layer 1a, and the gate insulating layer 2, at step ST1 illustrated in FIG. 12, a conductive polysilicon film is formed, and then, the polysilicon film is patterned to form the polysilicon layer 81a extending in the first direction Y intersecting the semiconductor layer 1a.

Next, at step ST2 illustrated in FIG. 12, in a state in which an etching mask is formed, the polysilicon layer 81a and the second interlayer insulating layer 41 are etched to form the second contact hole 41g. Therefore, the polysilicon layer 81a is not present inside the second contact hole 41g. Next, after forming a light shielding film, the light shielding film is patterned to form the light shielding layer 82a, as illustrated in FIG. 10.

6. Main Effects of Present Exemplary Embodiment

As described above, in the electro-optical device 100 according to the present exemplary embodiment, light incident from the second substrate 20 side is blocked by the wiring lines, such as the data lines 6a and the capacitance lines 7a provided on the second substrate 20 side with respect to the semiconductor layer 1a, and the capacitance element 55. Thus, incidence of the light on the semiconductor layer 1a is suppressed. Further, even when light emitted from the first substrate 10 side enters once again from the first substrate 10 side, the light is blocked by the scanning lines 3a provided on the substrate main body 19 side with respect to the semiconductor layer 1a, so incidence of the light on the semiconductor layer 1a is suppressed. Further, light traveling in the first direction Y intersecting the semiconductor layer 1a is blocked by the gate electrode 8a provided inside the first hole portions 41a1 and 41b1, which extend along the semiconductor layer 1a on both sides of the semiconductor layer 1a, of the second contact hole 41g that electrically couples the gate electrode 8a with the scanning line 3a. Thus, the incidence of light on the semiconductor layer 1a is suppressed.

Here, the semiconductor layer 1a extends in the second direction X along the scanning line 3a, and a first contact hole 43a, which electrically couples the data line-side source drain region 1t and the data line 6a, is provided in an end portion of the semiconductor layer 1a on the first side X1 in the second direction X. Thus, the capacitive element 55 cannot be provided in the vicinity of the end portion of the semiconductor layer 1a on the first side X1 in the second direction X, and sufficient light shielding cannot be performed by the capacitance element 55. Nevertheless, in the present exemplary embodiment, since the second contact hole 41g includes the second hole portions 41a2 and 41b2 that extend in the first direction Y intersecting the semiconductor layer 1a, light traveling from the first side X1 to the second side X2 in the second direction X can be blocked by the gate electrode 8a provided inside the second hole portions 41a2 and 41b2. Therefore, the incidence of light on the pixel electrode-side source drain region 1e side can be suppressed by the channel region 1c of the semiconductor layer 1a. As a result, it is possible to suppress an occurrence of deterioration, caused by an optical current, and the like, in characteristics of the transistor 30.

In particular, in the present exemplary embodiment, by providing the pixel electrode-side LDD region 1f between the channel region 1c and the pixel electrode-side source drain region 1e, an off-leak current of the transistor 30 is reduced, and at the same time, the incidence of light traveling from the first side X1 to the second side X2 in the second direction X on the pixel electrode-side LDD region 1f is suppressed by the second hole portions 41a2 and 41b2. Further, since the first hole portions 41a1 and 41b1 are provided at least along the pixel electrode-side LDD region 1f, light traveling from the first direction Y intersecting the semiconductor layer 1a, toward the pixel electrode-side LDD region 1f can be blocked by the first hole portions 41a1 and 41b1. Therefore, the incidence of light on the pixel electrode-side LDD region 1f is efficiently suppressed. Thus, the transistor 30 can sufficiently exhibit the characteristics of the LDD structure.

Further, since the capacitance element 55 includes a first element portion 551 extending in the second direction X so as to overlap with the semiconductor layer 1a, and a second element portion 552 extending in the first direction Y so as to overlap with the data line 6a, the capacitance element 55 suppresses the incidence of light over a wide area of the semiconductor layer 1a, and also has a large electrostatic capacitance.

Further, the gate electrode 8a includes the conductive polysilicon layer 81a and the light shielding layer 82a, and the light shielding layer 82a is provided along the side surface of the second contact hole 41g. Thus, the gate electrode 8a has high light shielding properties.

Second Exemplary Embodiment

Figure 13:
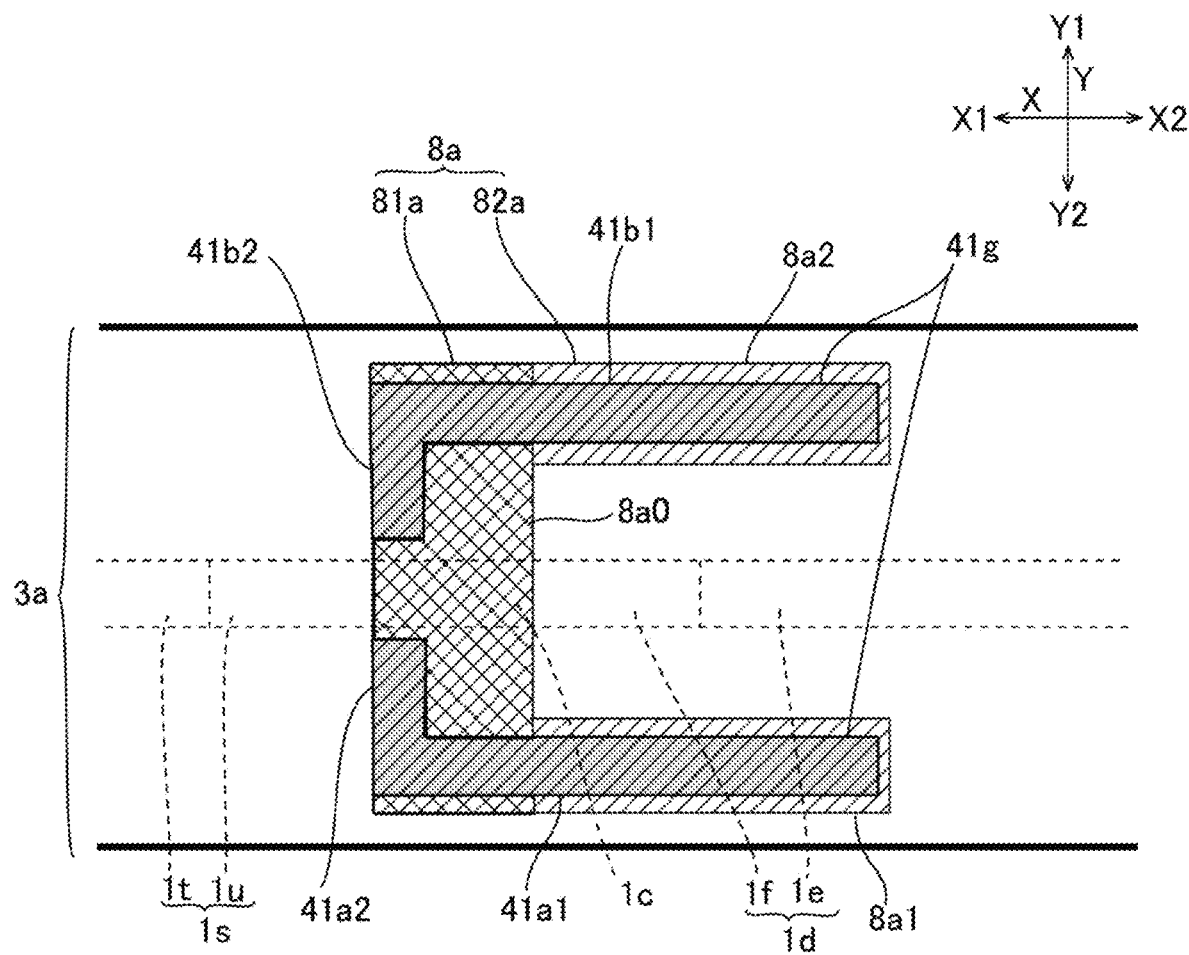
FIG. 13 is an explanatory diagram illustrating the electro-optical device according to a second exemplary embodiment of the present disclosure.

FIG. 13 is an explanatory diagram illustrating the electro-optical device according to a second exemplary embodiment of the present disclosure. FIG. 13 illustrates an enlarged planar configuration of the periphery of the second contact hole 41g. Note that basic configurations in this exemplary embodiment are the same as those of the first exemplary embodiment, and thus, common portions will be denoted by the same reference signs and a description of the common portions will be omitted.

As illustrated in FIG. 13, in the electro-optical device according to the present exemplary embodiment also, similarly to the first exemplary embodiment, the second contact hole 41g that electrically couples the gate electrode 8a with the scanning line 3a is provided in the second interlayer insulating layer 41 illustrated in FIG. 5 and FIG. 6. Similarly to the first exemplary embodiment, the second contact hole 41g includes the first hole portions 41a1 and 41b1 extending along the second direction X on both sides of the semiconductor layer 1a, and the second hole portions 41a2 and 41b2 extending along the first direction Y, and the first hole portions 41a1 and 41b1 and the second hole portions 41a2 and 41b2 are all provided at the positions overlapping with both the gate electrode 8a and the scanning line 3a. The second hole portions 41a2 and 41b2 are the portions respectively protruding from the first hole portions 41a1 and 41b1 toward the semiconductor layer 1a, and the second hole portions 41a2 and 41b2 respectively protrude from the first hole portions 41a1 and 41b1 toward the channel region 1c of the semiconductor layer 1a.

Here, the second hole portions 41a2 and 41b2 respectively protrude from end portions, on the first side X1 in the second direction X, of the first hole portions 41a1 and 41b1 toward the channel region 1c of the semiconductor layer 1a, and the first hole portions 41a1 and 41b1 do not respectively protrude from the second hole portions 41a2 and 41b2 to the first side X1 in the second direction X.

With such a configuration also, similarly to the first exemplary embodiment, the light traveling from the first side X1 to the second side X2 in the second direction X can be blocked by the gate electrode 8a provided inside the second hole portions 41a2 and 41b2, and thus, the same effects as those of the first exemplary embodiment, including the effect of being able to suppress the incidence of light on the pixel electrode-side LDD region 1f and the like, can be achieved.

Third Exemplary Embodiment

Figure 14:
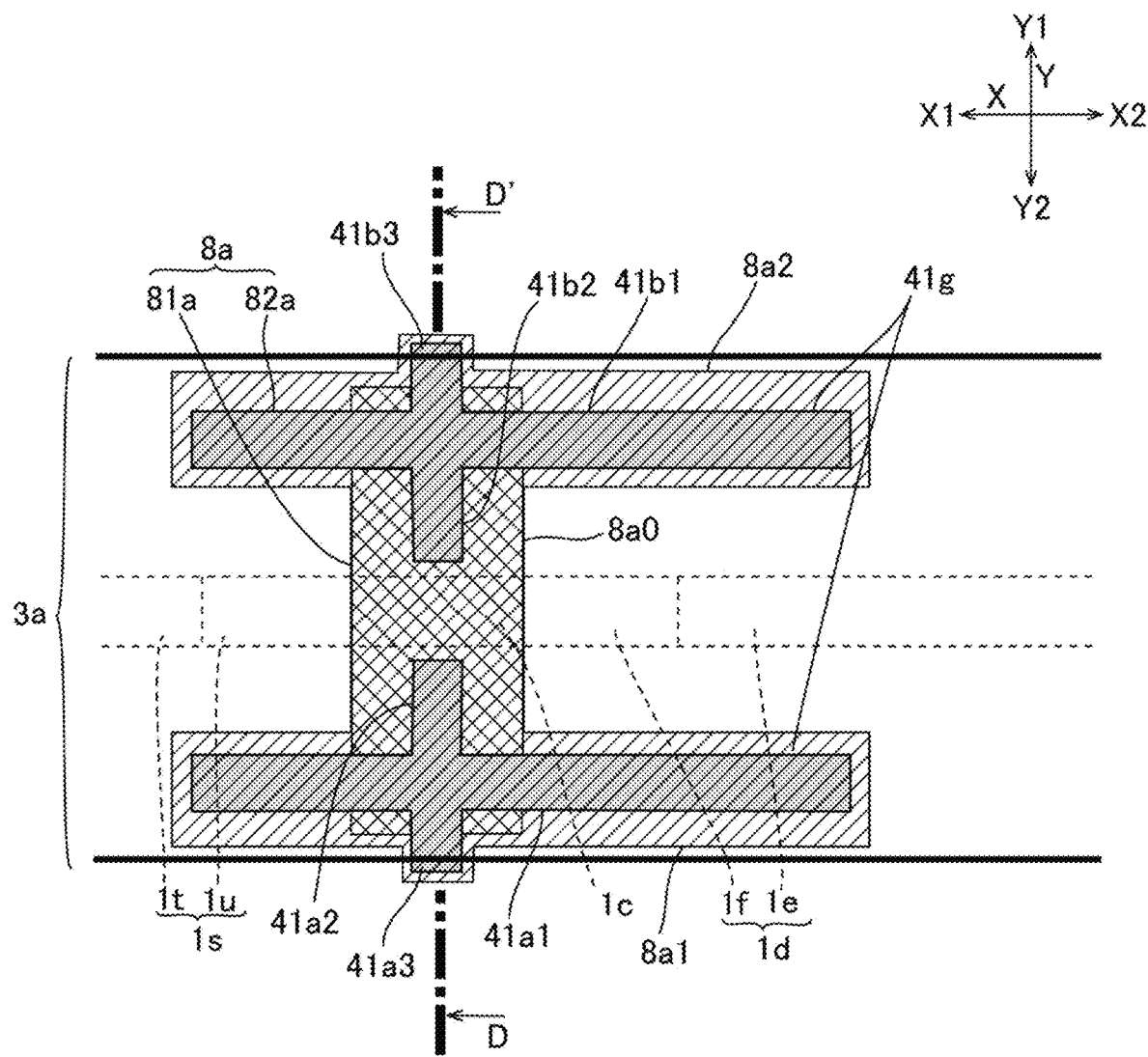
FIG. 14 is a plan view of the second contact hole and the like according to a third exemplary embodiment of the present disclosure.
Figure 15:
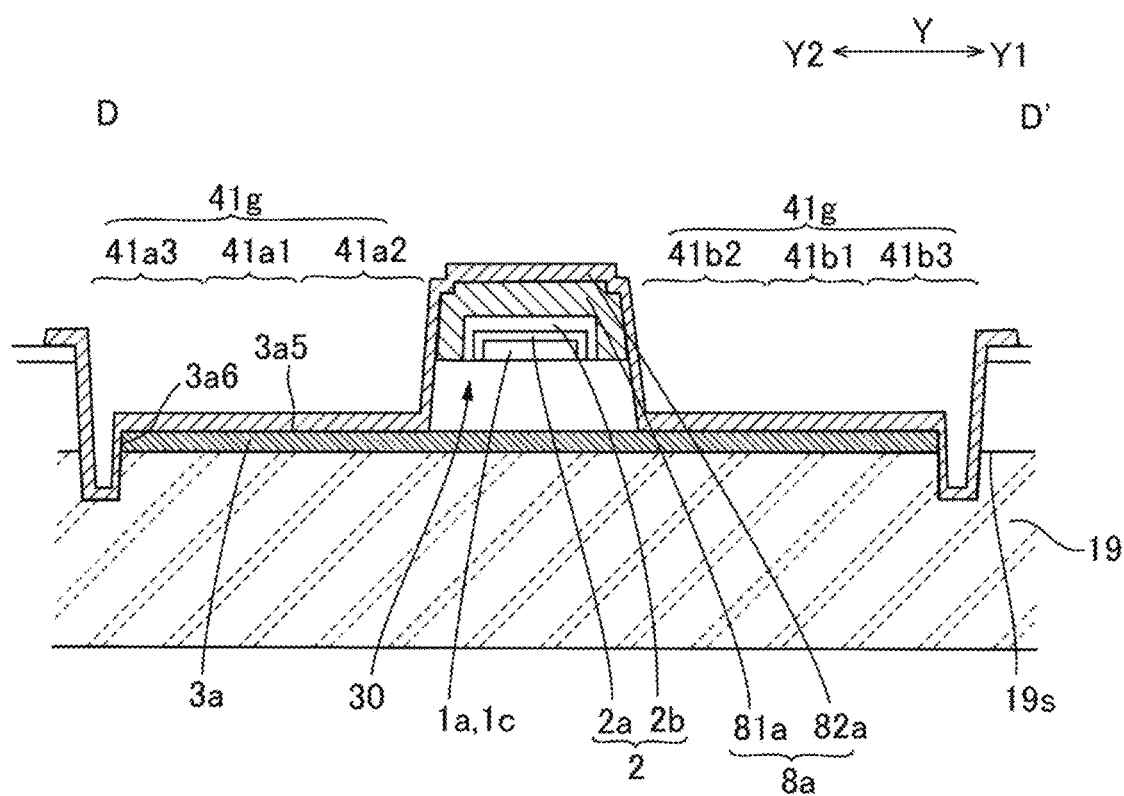
FIG. 15 is a cross-sectional view taken along a line D-D' illustrated in FIG. 14.

FIG. 14 is a plan view of the second contact hole 41g and the like of the electro-optical device according to a third exemplary embodiment of the present disclosure. FIG. 15 is a cross-sectional view taken along a line D-D' illustrated in FIG. 15. Note that basic configurations in this exemplary embodiment are the same as those of the first exemplary embodiment, and thus, common portions will be denoted by the same reference signs and a description of the common portions will be omitted.

As illustrated in FIG. 14 and FIG. 15, in the electro-optical device according to the present exemplary embodiment also, similarly to the first exemplary embodiment, the second contact hole 41g that electrically couples the gate electrode 8a with the scanning line 3a is provided in the second interlayer insulating layer 41 illustrated in FIG. 5 and FIG. 6. Similarly to the first exemplary embodiment, the second contact hole 41g includes the first hole portions 41a1 and 41b1 extending along the second direction X on both sides of the semiconductor layer 1a, and the second hole portions 41a2 and 41b2 extending along the first direction Y, and the first hole portions 41a1 and 41b1 and the second hole portions 41*a*2 and 41*b*2 are all provided at the positions overlapping with both the gate electrode 8*a* and the scanning line 3*a*. The second hole portions 41*a*2 and 41*b*2 are the portions respectively protruding from the first hole portions 41*a*1 and 41*b*1 toward the semiconductor layer 1*a*, and the second hole portions 41*a*2 and 41*b*2 respectively protrude from the first hole portions 41*a*1 and 41*b*1 toward the channel region 1*c* of the semiconductor layer 1*a*.

In the present exemplary embodiment, in regions not overlapping with the scanning line 3*a*, portions of the second contact hole 41*g* are provided up to a position beyond the surface 3*a*5 on the semiconductor layer 1*a* side of the scanning line 3*a*, on the opposite side from the semiconductor layer 1*a*. Therefore, the gate electrode 8*a* is in contact with the surface 3*a*5, on the semiconductor layer 1*a* side, of the scanning line 3*a* and a side surface 3*a*6 of the scanning line 3*a*.

More specifically, the second contact hole 41*g* includes third hole portions 41*a*3 and 41*b*3 respectively protruding from the first hole portions 41*a*1 and 41*b*1 toward the opposite side from the semiconductor layer 1*a* in plan view, and, in regions not overlapping with the scanning line 3*a*, portions of the third hole portions 41*a*3 and 41*b*3 are provided up to a position beyond the surface 3*a*5 on the semiconductor layer 1*a* side of the scanning line 3*a*, on the opposite side from the semiconductor layer 1*a*. In the present exemplary embodiment, a portion of each of the third hole portions 41*a*3 and 41*b*3 reaches the substrate main body 19, and a portion of the gate electrode 8*a* is in contact with the substrate main body 19.

Also with such a configuration, similarly to the first exemplary embodiment, the light traveling from the first side X1 to the second side X2 in the second direction X can be blocked by the gate electrode 8*a* provided inside the second hole portions 41*a*2 and 41*b*2, and thus, the same effects as those of the first exemplary embodiment, including the effect of being able to suppress the incidence of light on the pixel electrode-side LDD region 1*f* and the like, can be achieved. Further, while using the scanning line 3*a* as an etching stopper, the second contact hole 41*g* is formed to a deep position. Thus, the scanning line 3*a* can be reliably exposed at the bottom of the second contact hole 41*g*. Therefore, the gate electrode 8*a* can be reliably electrically coupled to the scanning line 3*a* via the second contact hole 41*g*.

Example of Installation in Electronic Apparatus

Figure 16:
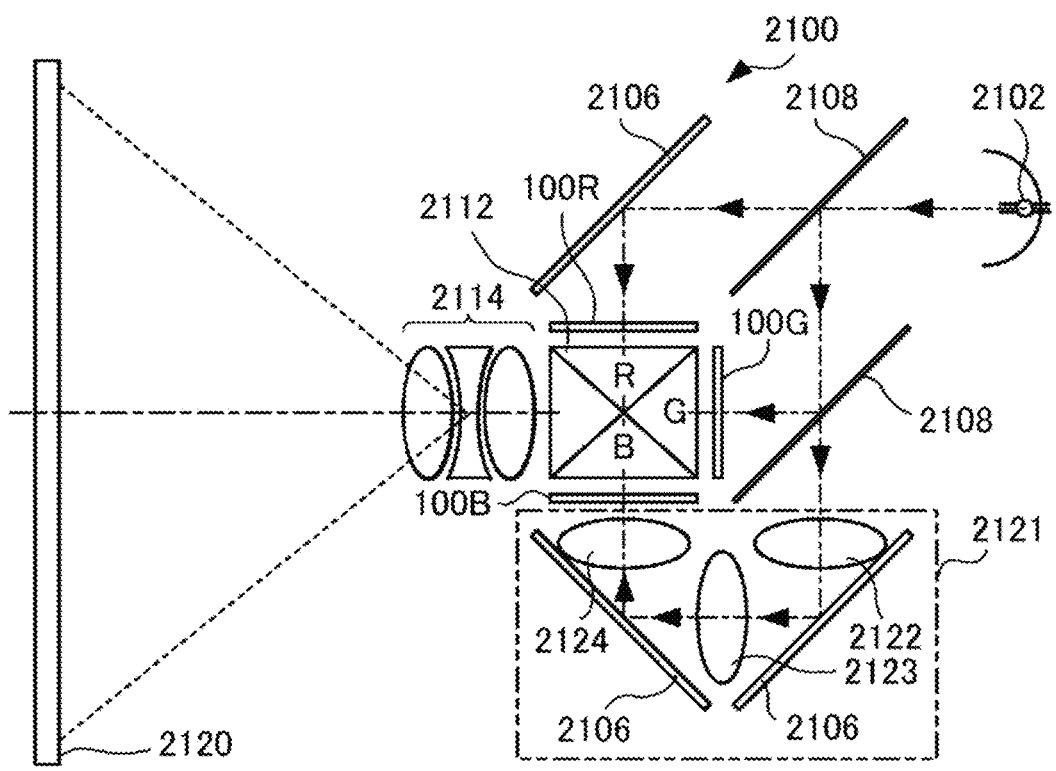
FIG. 16 is a schematic configuration view of a projection-type display apparatus using the electro-optical device to which the present disclosure is applied.

An electronic apparatus using the electro-optical device 100 according to the above-described exemplary embodiments will be described below. FIG. 16 is a schematic configuration view of a projection-type display apparatus using the electro-optical device 100 to which the present disclosure is applied. An illustration of optical elements, such as a polarizing plate, is omitted in FIG. 16. A projection-type display apparatus 2100 illustrated in FIG. 16 is an example of the electronic apparatus using the electro-optical device 100. The projection-type display device 2100, in which the electro-optical device 100 is used as a light valve, can perform high-definition and bright display without making the apparatus large. As illustrated in FIG. 17, a light source unit 2102 including a white light source, such as a halogen lamp, and the like is provided inside the projection-type display apparatus 2100. Projection light emitted from the light source unit 2102 is split into three primary colors of R (red), G (green), and B (blue) by three mirrors 2106 and two dichroic mirrors 2108 installed inside. The split incident light is guided to light valves 100R, 100G, and 100B corresponding to each of the primary colors, and then modulated. Note that since the light of the B color has a long optical path compared to the other light of the R color and the G color, the light of the B color is guided via a relay lens system 2121 including an incidence lens 2122, a relay lens 2123, and an emission lens 2124, to prevent loss due to the long optical path of the light of the B color.

The light modulated by each of the light valves 100R, 100G, and 100B is incident on a dichroic prism 2112 from three directions. Then, at the dichroic prism 2112, the light of the R color and the light of the B color are reflected at 90 degrees, and the light of the G color is transmitted. Therefore, after images of each of the primary colors are synthesized, a color image is projected onto a screen 2120 by a projection optical system 2114.

Other Projection-Type Display Apparatuses

Note that the projection-type display apparatus may include a configuration in which an LED light source or the like configured to emit light of each color is used as a light source unit and the light of each color emitted from the LED light source is supplied to another liquid-crystal device.

Other Electronic Apparatuses

The electronic apparatus including the electro-optical device 100 to which the present disclosure is applied is not limited to the projection-type display device 2100 of the above-described exemplary embodiment. Examples of the electronic apparatus may include a projection-type head up display, a direct-view-type head mounted display, a personal computer, a digital still camera, and a liquid crystal television.

What is claimed is:

1. An electro-optical device comprising:
a first data line extending along a first direction;
a second data line adjacent to the first data line, the second data line extending along the first direction;
a scanning line extending along a second direction intersecting the first direction;
a pixel electrode;
a transistor including a gate electrode and a semiconductor layer extending, in the second direction, in an overlapping manner with the scanning line in plan view, the semiconductor layer including:
a data line-side source drain region electrically connected to the first data line,
a channel region overlapping with the gate electrode in plan view,
a pixel electrode-side source drain region electrically connected to the pixel electrode,
a data line-side LDD (lightly doped drain) region interposed between the channel region and the data line-side source drain region in plan view, and
a pixel electrode-side LDD region interposed between the channel region and the pixel electrode-side source drain region in plan view;
a first interlayer insulating layer provided in a layer between the first data line and the transistor, and including a first contact hole for electrically connecting the first data line with the data line-side source drain region of the semiconductor layer of the transistor; and
a second interlayer insulating layer provided in a layer between the scanning line and the transistor, and including a second contact hole for electrically connecting the scanning line with the gate electrode of the transistor, the second contact hole provided between the first data line and the second data line in plan view, wherein the second contact hole includes:
a first hole portion including:
a first portion extending along the data line-side LDD region of the semiconductor layer,
a second portion extending along the pixel electrode-side LDD region of the semiconductor layer, and
a third portion extending along the channel region of the semiconductor layer and provided between the first portion and the second portion in plan view, the third portion having a first side that extends along the channel region and a second side that extends along the first side at an opposite side to the channel region side of the first hole portion, and
a second hole portion protruding from the first side of the first hole portion toward the channel region of the semiconductor layer, and
the first hole portion and the second hole portion are not overlapped with the semiconductor layer in plan view.

2. The electro-optical device according to claim 1, wherein
the second hole portion is a portion protruding from the first hole portion toward the semiconductor layer.

3. The electro-optical device according to claim 1, comprising:
a capacitance element provided in a layer between the first data line and the transistor, and separated from the first contact hole in plan view, wherein
the capacitance element includes a first element portion extending, in the second direction, in an overlapping manner with the semiconductor layer in plan view, and a second element portion extending, in the first direction, in an overlapping manner with the first data line in plan view.

4. The electro-optical device according to claim 1, comprising:
a pixel electrode provided corresponding to the transistor, wherein
the semiconductor layer includes a channel region overlapping with the gate electrode in plan view, a pixel electrode-side source drain region electrically connected to the pixel electrode, and a pixel electrode-side LDD region interposed between the channel region and the pixel electrode-side source drain region in plan view, and
the first hole portion is provided at least along the pixel electrode-side LDD region.

5. The electro-optical device according to claim 1, wherein
in a region not overlapping with the scanning line in plan view, a portion of the second contact hole is provided up to a position on an opposite side of the scanning line from the semiconductor layer side.

6. The electro-optical apparatus according to claim 5, wherein
the second contact hole includes a third hole portion protruding from the first hole portion toward the opposite side from the semiconductor layer in plan view, and
in a region not overlapping with the scanning line in plan view, a portion of the third hole portion is provided to a position on the opposite side of the scanning line from the semiconductor layer side.

7. The electro-optical device according to claim 1, wherein
the gate electrode includes a conductive polysilicon layer and a light shielding layer, and
the light shielding layer is provided along a side surface of the second contact hole.

8. An electronic apparatus comprising:
the electro-optical device according to claim 1.

9. The electro-optical device according to claim 1, wherein
the second hole portion has a first distance from the first end in the second direction and a second distance from the second end in the second direction,
the first distance has a non-zero value, and
the second distance has a non-zero value.

* * * * *